(12) United States Patent
Reinman et al.

(10) Patent No.: US 10,176,882 B1
(45) Date of Patent: Jan. 8, 2019

(54) SECURE STORAGE APPARATUS (71) Applicant: Cisco Technology, Inc., San Jose, CA (US)

(72) Inventors: Tzachy Reinman, Elazar (IL); Tsion Shamay, Beney Reem (IL); Yair Fodor, Petah-Tikva (IL)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/636,778

(22) Filed: Jun. 29, 2017

(51) Int. Cl.
*G11C 17/00* (2006.01)
*G11C 17/16* (2006.01)
*G11C 17/18* (2006.01)
*H01L 27/112* (2006.01)
*G11C 16/10* (2006.01)
*G11C 16/26* (2006.01)
*G11C 7/12* (2006.01)

(52) U.S. Cl.
CPC .............. *G11C 17/16* (2013.01); *G11C 7/12* (2013.01); *G11C 16/10* (2013.01); *G11C 16/26* (2013.01); *G11C 17/18* (2013.01); *H01L 27/11206* (2013.01)

(58) Field of Classification Search
CPC ........... G11C 17/16; G11C 7/12; G11C 16/10; G11C 16/26; G11C 17/18; H01L 27/11206
USPC .......................................................... 365/94
See application file for complete search history.

(56) References Cited

U.S. PATENT DOCUMENTS

| | | | |
|---|---|---|---|
| 7,227,802 B2 | 6/2007 | Jung et al. | |
| 8,375,189 B2 | 2/2013 | Qawami et al. | |
| 8,898,425 B1 | 11/2014 | Pollack et al. | |
| 9,019,742 B2 | 4/2015 | Chung | |
| 9,076,526 B2 | 7/2015 | Chung | |
| 9,251,893 B2 | 2/2016 | Chung | |
| 9,324,438 B2 | 4/2016 | Liu et al. | |
| 9,465,559 B2 | 10/2016 | Butler et al. | |
| 2005/0232039 A1 | 10/2005 | Hsu | |
| 2007/0030026 A1 | 2/2007 | Hsu et al. | |
| 2009/0207665 A1* | 8/2009 | Louie ..................... | G11C 16/22 365/185.22 |
| 2012/0047322 A1 | 2/2012 | Chung | |
| 2012/0069995 A1 | 3/2012 | Matthews, Jr. | |
| 2014/0068278 A1 | 3/2014 | Nagai et al. | |
| 2016/0276043 A1 | 9/2016 | Chung | |

FOREIGN PATENT DOCUMENTS

CN    203773957    8/2014

* cited by examiner

*Primary Examiner* — Huan Hoang (57) ABSTRACT

In one embodiment, an apparatus includes a non-volatile memory, a one-time programmable (OTP) memory, and a processor operative to write data values to the non-volatile memory and then initiate programming of a first bit of the OTP memory, the first bit being associated with locking the non-volatile memory from further data being written thereto, and after the non-volatile memory has been locked from further data being written thereto, initiate programming of the second bit of the OTP memory in order to lock the non-volatile memory from further data being erased therefrom.

20 Claims, 6 Drawing Sheets

FIG. 6

SECURE STORAGE APPARATUS

TECHNICAL FIELD

The present disclosure generally relates to a secure storage apparatus.

BACKGROUND

Non-volatile memory (NVM) comes in many forms and may be programmed before being deployed in the field. NVM retains its data during power loss. NVM can typically be written to, erased, and then written to again etc. After programming, the NVM may be locked as read-only. For example, NVM may be programmed during chip serialization and is then locked as read-only. The locking may be performed using a one-time programmable (OTP) memory, which by its nature can only be written to and not erased. Chip serialization may include writing code and/or data (some of which is unique per chip and/or secret) into the NVM.

BRIEF DESCRIPTION OF THE DRAWINGS

The present disclosure will be understood and appreciated more fully from the following detailed description, taken in conjunction with the drawings in which.

DESCRIPTION OF EXAMPLE EMBODIMENTS

Overview

There is provided in accordance with an embodiment of the present disclosure, an apparatus including a non-volatile memory, a one-time programmable (OTP) memory including a plurality of bits, and a processor operatively connected to the non-volatile memory and the OTP memory, wherein the processor is operative to write a plurality of data values to the non-volatile memory and then initiate programming of a first bit of the plurality of bits of the OTP memory, the first bit being associated with locking the non-volatile memory from further data being written thereto, and after the non-volatile memory has been locked from further data being written thereto, initiate programming of a second bit of the OTP memory in order to lock the non-volatile memory from data being erased therefrom.

There is also provided in accordance with another embodiment of the present disclosure, a method for further configuring a partially configured apparatus, the partially configured apparatus including a non-volatile memory including a plurality of data values written thereto, the non-volatile memory being locked from further data being written thereto, and a one-time programmable (OTP) memory including a first bit which is programmed, the first bit being associated with locking the non-volatile memory from further data being written thereto, the method including checking a programming of a second bit of the OTP memory to determine if the non-volatile memory is unlocked for erasing data therefrom, the second bit being associated with locking the non-volatile memory from data being erased therefrom, erasing at least one data value of the plurality of data values previously written to the non-volatile memory, and initiating programming of the second bit of the OTP memory in order to lock the non-volatile memory from data being erased therefrom.

There is also provided in accordance with still another embodiment of the present disclosure, a method for partially configuring an apparatus, the apparatus including a non-volatile memory, and a one-time programmable (OTP) memory including a plurality of bits, wherein the method includes writing a plurality of data values to the non-volatile memory, and then initiating programming of a first bit of the plurality of bits of the OTP memory but not initiating programming of a second bit of the OTP memory, the first bit being associated with locking the non-volatile memory from further data being written thereto, the second bit being associated with locking the non-volatile memory from data being erased therefrom.

DETAILED DESCRIPTION

Figure 1:
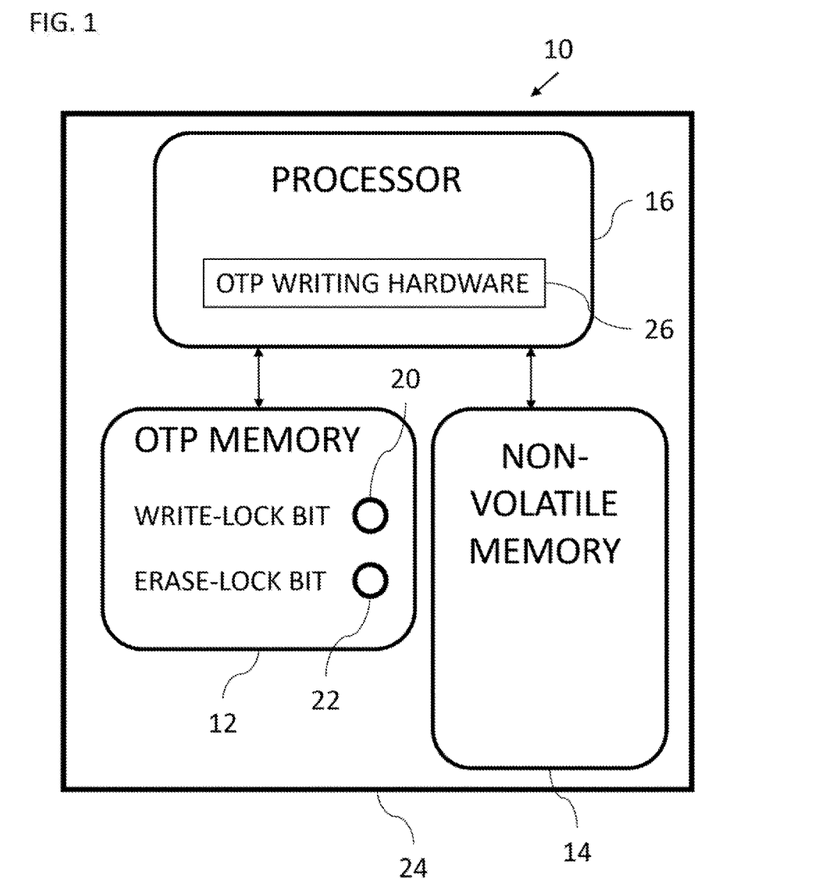
FIG. 1 is a block diagram view of a secure storage apparatus constructed and operative in accordance with an embodiment of the present disclosure.

Reference is now made to FIG. 1, which is a block diagram view of a secure storage apparatus 10 constructed and operative in accordance with an embodiment of the present disclosure. The secure storage apparatus 10 includes a one-time programmable (OTP) memory 12, a non-volatile memory (NVM) 14 and a processor 16. The processor 16 is operatively connected to the OTP memory 12 and the NVM 14.

By way of introduction, there are use-cases where not all the information that is to be written to the NVM 14 is known at the serialization stage. For example, at the time of serialization the exact purpose of the chip and/or who the chip will be sold to may be unknown or in doubt. Waiting until all this information is known may be very costly, both in monetary terms and from an inventory management perspective regarding time-to-market delays.

The secure storage apparatus 10 enables extending the process of finalizing the NVM 14. Instead of the NVM 14 being finalized and locked in one stage, the secure storage apparatus 10 enables a two-stage process. In the first stage (for example, during serialization in a secure environment), multiple options of data are written to the NVM 14 by the processor 16. In the first stage, it is still unknown or undecided which of the data options is the desired one or ones. At the end of the first stage, the NVM 14 is locked for being written thereto. In the second stage, at a later time, which may be in a non-secure environment, one or more of the data options may be chosen, and the processor 16 erases all the non-chosen options. In the second stage, after the erasing of all the non-chosen options, the NVM 14 is also locked for being erased therefrom, thereby rendering the NVM 14 a read-only memory. In accordance with some embodiments, in the second stage, none of the data options are erased, or all of the data options are erased, prior to locking the NVM 14 for erasing data therefrom.

Locking of the NVM 14 is now described in more detail. Writing to, erasing from, and reading from, the NVM 14 is typically performed by the processor 16. The OTP memory 12 includes a plurality of bits 20, 22 which may be programmed and used as flags to indicate locking of the NVM 14 for writing and erasing. The bit 20 is a write-lock bit and is associated with locking the NVM 14 for data being written thereto (i.e., to the NVM 14). The bit 22 is an erase-lock bit is associated with locking the NVM 14 for data being erased therefrom (i.e., from the NVM 14). It will be appreciated that in some embodiments, more than one OTP bit 20, 22 may be employed as a write-lock and/or erase-lock bit. Other processors that are external to the secure storage apparatus 10, for example, but not limited to, a general central processing unit (CPU), are typically restricted from writing to, erasing from, and reading from, the NVM 14 at any time, for example, due to security concerns.

The processor 16 is operative to check the programming of the bits 20, 22 in order to determine if the NVM 14 is unlocked for writing thereto (i.e., to the NVM 14) or erasing therefrom (i.e., from the NVM 14) prior to writing or erasing data, respectively. In this manner, the processor 16 is operative to refrain from writing data to, or erasing data from, the NVM 14, when the NVM 14 is locked for writing data thereto, or erasing data therefrom, respectively, as indicated by the programming of the bits 20, 22 of the OTP memory 12. The enforcement of the locking mechanism may be performed by suitable hardware. The NVM 14 is indicated as being locked for writing data thereto when the write-lock bit 20 of the OTP memory 12 is programmed. The NVM 14 is indicated as being locked for erasing data therefrom, when the erase-lock bit 22 of the OTP memory 12 is programmed. The locking of the NVM 14 for writing and erasing is typically irreversible as the programming of the OTP memory 12 is typically irreversible. The embodiment of FIG. 1 shows that the OTP memory 12, the NVM 14, and the processor 16 are disposed on a single piece of silicon 24. Disposing the OTP memory 12, the NVM 14 and the processor 16 on the single piece of silicon 24 generally improves security of the secure storage apparatus 10 by preventing tampering of the individual elements of the secure storage apparatus 10 and the communication lines between the OTP memory 12, the NVM 14 and the processor 16.

In practice, some or all of the functions of the processor 16 may be combined in a single physical component or, alternatively, implemented using multiple physical components. These physical components may comprise hard-wired or programmable devices, or a combination of the two. It will be appreciated that hard-wired devices may be more secure. In some embodiments, at least some of the functions of the processing circuitry may be carried out by a programmable processor executing suitable software. The software may be stored in tangible, non-transitory computer-readable storage media.

The OTP memory 12 may be any suitable non-volatile memory that permits data to be written, but not erased, for example, but not limited to, based on programmable fuses or anti-fuses. Once the OTP memory 12 has been programmed, the OTP memory 12 retains its value upon loss of power. The processor 16 includes OTP writing hardware 26 to program the bits 20, 22 of the OTP memory 12, for example, by burning fuses or anti-fuses in the OTP memory 12. In alternative embodiments, the OTP writing hardware 26 may be disposed externally to the processor 16. The secure storage apparatus 10 may be implemented in a smartcard or any suitable chip. The NVM 14 may be written to at a chip vendor or other serialization facility and may be finalized, in the second stage, in the same facility or in another facility.

The secure storage apparatus 10 is now described in more detail. Prior to writing any data to the NVM 14, the processor 16 is operative to check a programming of the write-lock bit 20 of the OTP memory 12 to determine if the NVM 14 is unlocked for writing data thereto. FIG. 1 shows the write-lock bit 20 as still being un-programmed.

Figure 2:
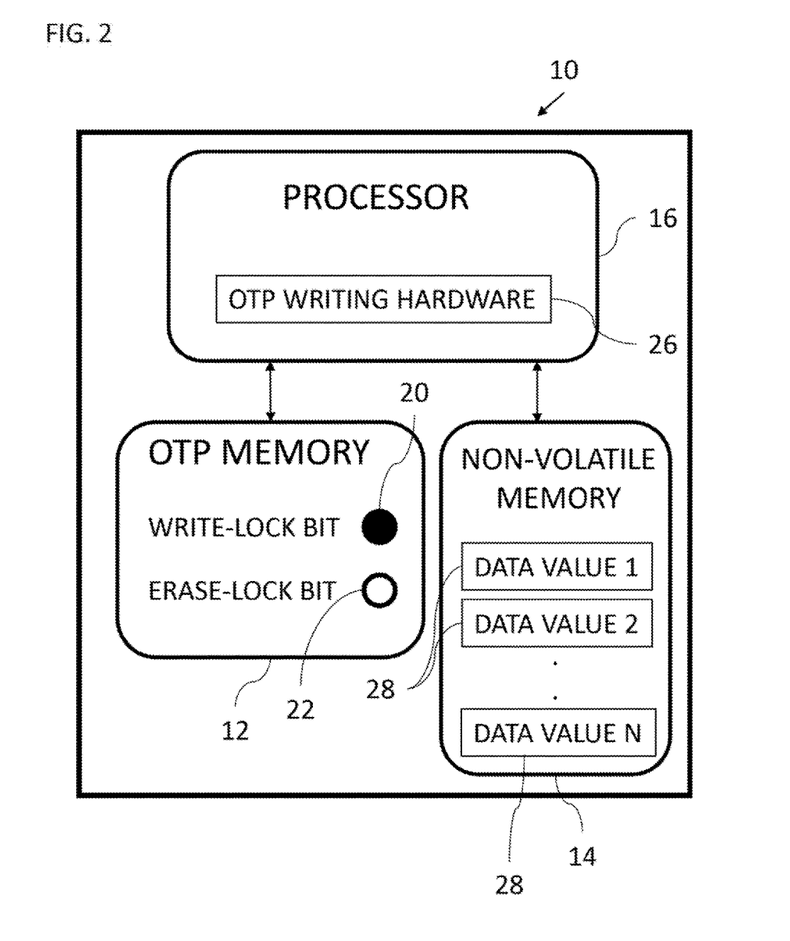
FIG. 2 is a block diagram view of the secure storage apparatus of FIG. 1 after a plurality of data values has been written.

Reference is now made to FIG. 2, which is a block diagram view of the secure storage apparatus 10 of FIG. 1 after a plurality of data values 28 has been written. If the write-lock bit 20 is determined to be un-programmed when checked by the processor 16 (described above with reference to FIG. 1), the processor 16 is operative to write the data values 28 to the NVM 14 and then initiate programming of the write-lock bit 20 of the OTP memory 12. Initiating programming of the write-lock bit 20 is optionally performed automatically in response to writing the data values 28 to the NVM 14. The processor 16 generally initiates programming of the write-lock bit 20 by instructing the OTP writing hardware 26 to program the write-lock bit 20. The write-lock bit 20 is associated with locking the NVM 14 from further data being written thereto (i.e., to the NVM 14). In some embodiments, when the OTP writing hardware 26 is included in the processor 16, initiating programming by the processor 16 may also include programming one or more of the bits 20, 22 of the OTP memory 12. The data values 28 may include any of the following: a plurality of cryptographic keys; a plurality of secrets (e.g., passwords); at least one identification; and/or at least one software code item. It should be noted that the erase-lock bit 22 of the OTP memory 12 is still left un-programmed at this stage.

In the second stage, after the NVM 14 has been locked from further data being written thereto, the processor 16 is operative to check a programming of the erase-lock bit 22 of the OTP memory 12 to determine if the NVM 14 is unlocked for data being erased therefrom (i.e., from the NVM 14). This check is performed prior to erasing the one or more of the data values 28. The erase-lock bit 22 is associated with locking the NVM 14 from data being erased therefrom (i.e., from the NVM 14).

Figure 3:
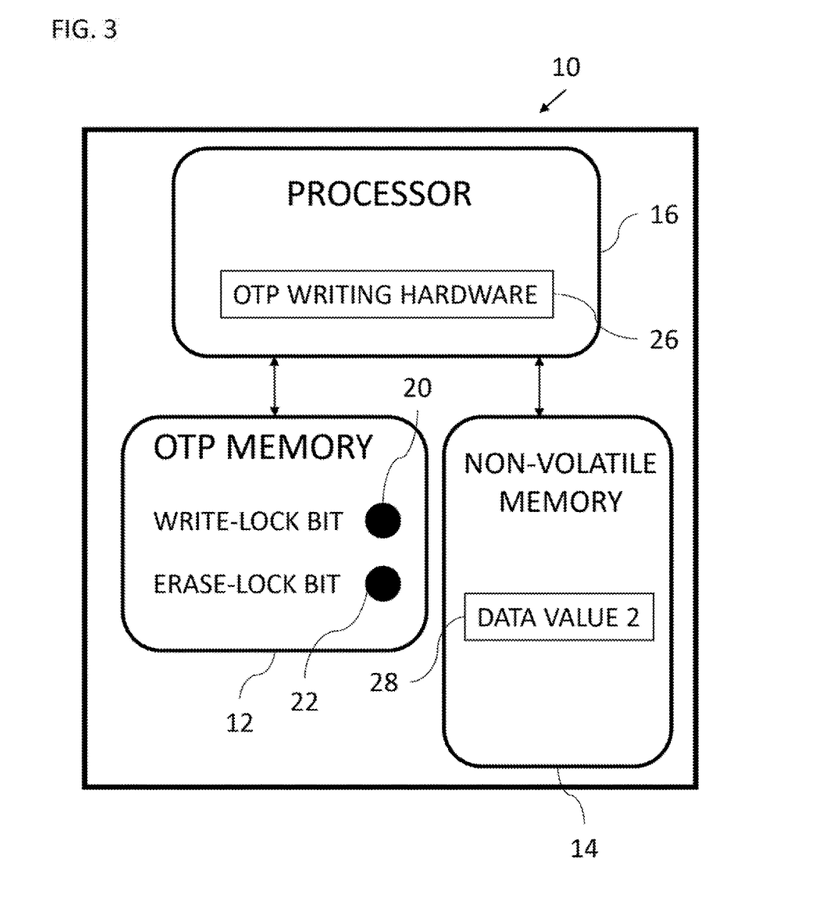
FIG. 3 is a block diagram view of the secure storage apparatus of FIG. 1 after at least one of the data values has been erased.

Reference is now made to FIG. 3, which is a block diagram view of the secure storage apparatus 10 of FIG. 1 after one or more of the data values 28 has been erased. After the NVM 14 has been locked from further data being written thereto, and after the processor 16 has determined that the NVM 14 is unlocked for data being erased therefrom, the processor 16 is operative to erase one or more of the data values 28 previously written to the NVM 14 by the processor 16 leaving one or more of the data values 28 in the NVM 14. After the one or more data values 28 have been erased, the processor 16 is operative to initiate programming of the erase-lock bit 22 of the OTP memory 12 in order to lock the NVM 14 from further data being erased therefrom (i.e., from the NVM 14). It should be noted that in some embodiments, none of the data options are erased, or all of the data options are erased, prior to locking the NVM 14 for erasing data therefrom. The processor 16 generally initiates programming of the erase-lock bit 22 by instructing the OTP writing hardware 26 to program the erase-lock bit 22. In accordance with an embodiment of the present disclosure, the processor 16 is operative to initiate programming of the erase-lock bit 22 in order to lock the NVM 14 from further data being erased therefrom (i.e., from the NVM 14) automatically in response to erasing the one or more data values 28 previously written to the NVM 14 by the processor 16. In some embodiments, to enhance security, the erasing the one or more data values 28 and the initiating programming of the erase-lock bit 22 is an atomic operation.

Once both the write-lock bit 20 and the erase-lock bit 22 have been programmed, the NVM 14 is locked for both writing and erasing and is thereby rendered read-only. The programming of the write-lock bit 20 and the erase-lock bit 22 is generally irreversible. Therefore, at this stage, the NVM 14 is read-only and still includes one or more of the data values 28 that were not erased from the NVM 14.

Figure 4:
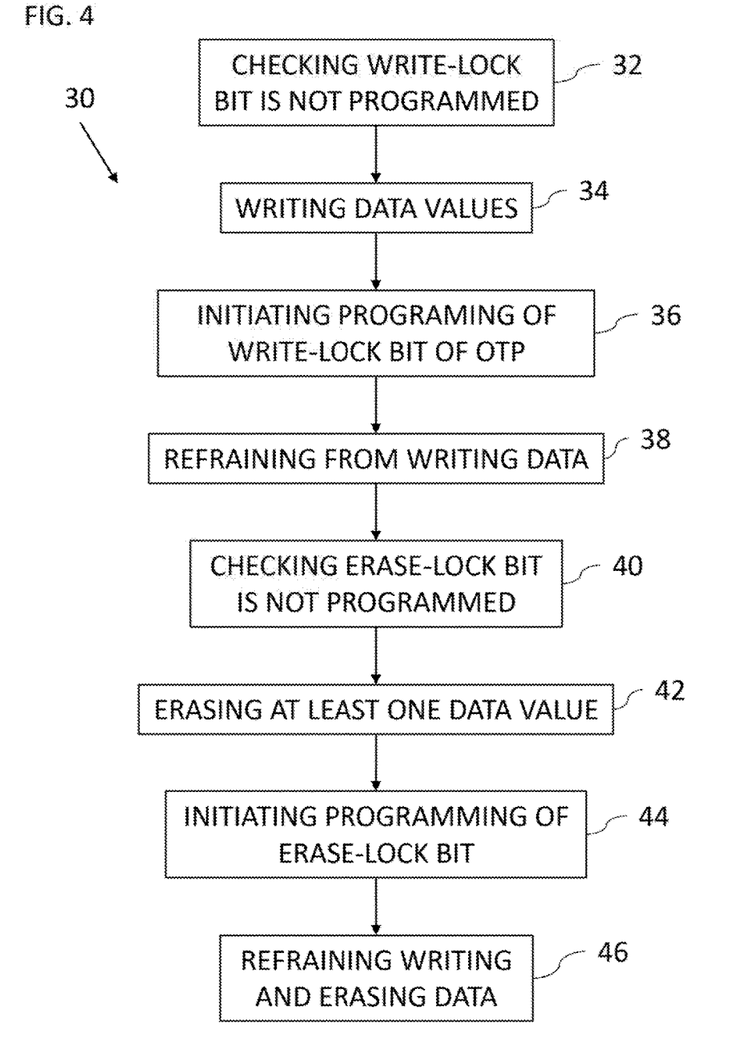
FIG. 4 is a flow chart showing exemplary steps in a method of operation of the secure storage apparatus of FIG. 1.

Reference is now made to FIG. 4, which is a flow chart showing exemplary steps in a method 30 of operation of the secure storage apparatus 10 of FIG. 1. Reference is also made to FIGS. 1-3. The first stage of the method 30 includes the following steps: checking (block 32) a programming of the write-lock bit 20 of the OTP memory 12 to determine if the NVM 14 is unlocked for writing data thereto (i.e., to the NVM 14); writing (block 34) the data values 28 to the NVM 14; and initiating (block 36) programming of the write-lock bit 20 of the OTP memory 12 but not initiating programming of the erase-lock bit 22 of the OTP memory 12; and as a result of the processing of the step of block 36, refraining from (block 38) writing data to the NVM 14 as the NVM 14 is locked for writing data thereto (i.e., to the NVM 14). The second stage of the method 30 includes the following steps: checking (block 40) a programming of the erase-lock bit 22 of the OTP memory 12 to determine if the NVM 14 is unlocked for erasing data therefrom (i.e., from the NVM 14); erasing (block 42) at least one data value 28 (but not all data values 28) of the plurality of data values 28 previously written to the NVM 14; initiating (block 44) programming of the erase-lock bit 22 of the OTP memory 12 in order to lock the NVM 14 from further data being erased therefrom (i.e., from the NVM 14), wherein the initiating the programming of the erase-lock bit 22 is performed automatically in response to the erasing of the at least one data value 28; and as a result of the steps of blocks 36 and 44, refraining from (block 46) writing data to, and erasing data from, the NVM 14, as the NVM 14 is locked for writing data thereto (i.e., to the NVM 14), and erasing data therefrom (i.e., from the NVM 14), respectively. In some embodiments the erasing the one or more data values 28 and the initiating programming of the erase-lock bit 22 is an atomic operation. It should be noted that in some embodiments, none of the data options are erased, or all of the data options are erased, prior to locking the NVM 14 for erasing data therefrom. The steps described above may be performed in the order shown above or in any suitable order.

Figure 5:
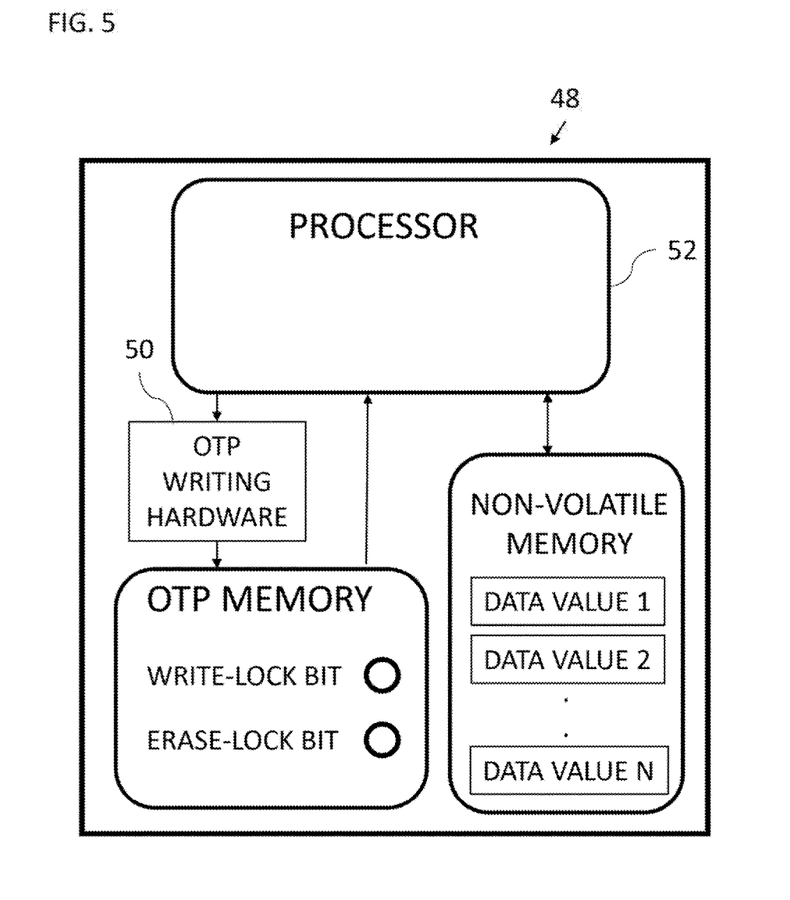
FIG. 5 is a block diagram view of a secure storage apparatus constructed and operative in accordance with a first alternative embodiment of the present disclosure.

Reference is now made to FIG. 5, which is a block diagram view of a secure storage apparatus 48 constructed and operative in accordance with a first alternative embodiment of the present disclosure. The secure storage apparatus 48 is substantially the same as the secure storage apparatus 10 of FIGS. 1-3, and the method 30 of FIG. 4, except that the secure storage apparatus 48 includes OTP writing hardware 50 and a processor 52 (similar to the processor 16 of FIG. 1) where the OTP writing hardware 50 is disposed externally to the processor 52.

Figure 6:
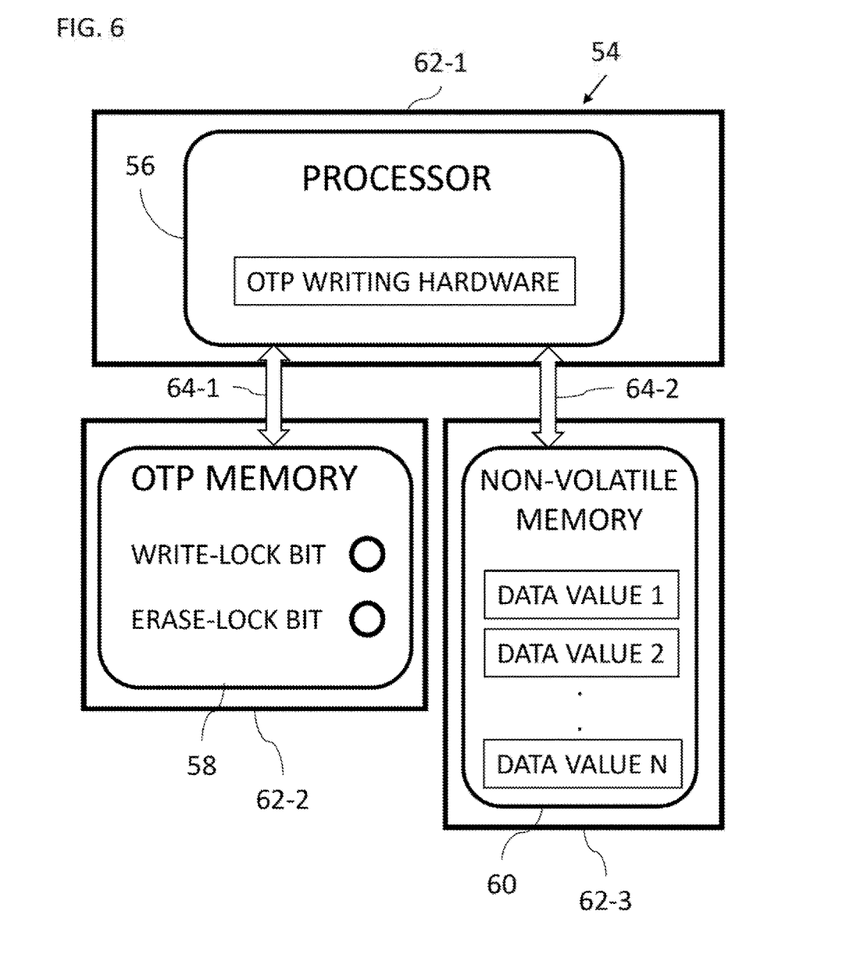
FIG. 6 is a block diagram view of a secure storage apparatus constructed and operative in accordance with a second alternative embodiment of the present disclosure.

Reference is now made to FIG. 6, which is a block diagram view of a secure storage apparatus 54 constructed and operative in accordance with a second alternative embodiment of the present disclosure. The secure storage apparatus 54 includes a processor 56, an OTP memory 58, and an NVM 60 broadly performing the same functions as the processor 16, the OTP memory 12, and the NVM 14 of the secure storage apparatus 10 of FIGS. 1-3, and the method 30 of FIG. 4, respectively. In contrast to FIGS. 1-3, the processor 56, the OTP memory 58 and the NVM 60 are each disposed on a different piece of silicon 62-1, 62-2, and 62-3, respectively. The processor 56 is generally connected to the OTP memory 58 and the NVM 60 for data transfer purposes via a secure communication channel 64-1, 64-2, respectively, for example, using Secure Access Control (SAC) or any suitable secure data transfer method. In accordance with another embodiment of the present disclosure, the OTP memory 58 or the NVM 60 may be disposed on the same piece of silicon as the processor 56.

It will be appreciated that various features of the disclosure which are, for clarity, described in the contexts of separate embodiments may also be provided in combination in a single embodiment. Conversely, various features of the disclosure which are, for brevity, described in the context of a single embodiment may also be provided separately or in any suitable sub-combination.

It will be appreciated by persons skilled in the art that the present disclosure is not limited by what has been particularly shown and described hereinabove. Rather the scope of the disclosure is defined by the appended claims and equivalents thereof.

What is claimed is:

1. An apparatus comprising: a non-volatile memory; a one-time programmable (OTP) memory including a plurality of bits; and a processor operatively connected to the non-volatile memory and the OTP memory, wherein the processor is operative to:

write a plurality of data values to the non-volatile memory and then initiate programming of a first bit of the plurality of bits of the OTP memory, the programming of the first bit being initiated to lock the non-volatile memory from further data being written thereto but not locking the non-volatile memory from data being erased therefrom; and after the non-volatile memory has been locked from further data being written thereto, initiate programming of a second bit of the OTP memory in order to lock the non-volatile memory from data being erased therefrom.

2. The apparatus according to claim 1, wherein, the processor is operative, after the non-volatile memory has been locked from further data being written thereto, to: check a programming of the second bit of the plurality of bits of the OTP memory to determine if the non-volatile memory is unlocked for data being erased therefrom, the second bit being associated with locking the non-volatile memory from data being erased therefrom; and erase at least one data value of the plurality of data values previously written to the non-volatile memory by the processor;

wherein the programming of the second bit of the OTP memory is initiated in order to lock the non-volatile memory from further data being erased therefrom.

3. The apparatus according to claim 1, wherein prior to writing the plurality of data values, the processor is operative to check a programming of the first bit of the OTP memory to determine if the non-volatile memory is unlocked for writing data thereto.

4. The apparatus according to claim 1, wherein:

the processor is operative to refrain from writing data to, or erasing data from, the non-volatile memory, when the non-volatile memory is locked for writing data thereto, or erasing data therefrom, respectively;

the non-volatile memory is indicated as being locked for writing data thereto when the first bit of the OTP memory is programmed; and the non-volatile memory is indicated as being locked for erasing data therefrom, when the second bit of the OTP memory is programmed.

5. The apparatus according to claim 1, wherein the plurality of data values includes any of the following: a plurality of cryptographic keys; a plurality of secrets; at least one identification; and at least one software code item.

6. The apparatus according to claim 1, wherein the OTP memory, the non-volatile memory and the processor are disposed on a single piece of silicon.

7. The apparatus according to claim 2, wherein the processor is operative to initiate programming of the second bit of the OTP memory in order to lock the non-volatile memory from further data being erased therefrom as an atomic operation with erasing the at least one data value of the plurality of data values previously written to the non-volatile memory by the processor.

8. The apparatus according to claim 1, wherein the programming of the first bit and the programming of the second bit of the OTP memory is irreversible.

9. A method for further configuring a partially configured apparatus, the partially configured apparatus comprising: a non-volatile memory including a plurality of data values written thereto, the non-volatile memory being locked from further data being written thereto; and a one-time programmable (OTP) memory including a first bit which is programmed, the first bit being associated with locking the non-volatile memory from further data being written thereto, the method comprising:

checking a programming of a second bit of the OTP memory to determine if the non-volatile memory is unlocked for erasing data therefrom, the second bit being associated with locking the non-volatile memory from data being erased therefrom;

erasing at least one data value of the plurality of data values previously written to the non-volatile memory; and after the non-volatile memory has been locked from further data being written thereto, initiating programming of the second bit of the OTP memory in order to lock the non-volatile memory from data being erased therefrom.

10. The method according to claim 9, wherein the checking is performed prior to the erasing.

11. The method according to claim 10, wherein the initiating programming is performed after the erasing.

12. The method according to claim 9, further comprising refraining from writing data to, or erasing data from, the non-volatile memory, when the non-volatile memory is locked for writing data thereto, or erasing data therefrom, respectively, wherein:

the non-volatile memory is indicated as being locked for writing data thereto when the first bit of the OTP memory is programmed; and the non-volatile memory is indicated as being locked for erasing data therefrom, when the second bit of the OTP memory is programmed.

13. The method according to claim 9, wherein the plurality of data values includes any of the following: a plurality of cryptographic keys; a plurality of secrets; at least one identification; and/or at least one software code item.

14. The method according to claim 9, wherein the initiating the programming of the second bit of the OTP memory in order to lock the non-volatile memory from further data being erased therefrom is performed as an atomic operation with the erasing of the at least one data value.

15. The method according to claim 9, wherein the programming of the first bit and the programming of the second bit of the OTP memory is irreversible.

16. A method for partially configuring an apparatus, the apparatus comprising: a non-volatile memory; and a one-time programmable (OTP) memory including a plurality of bits, wherein the method comprises:

writing a plurality of data values to the non-volatile memory; and then initiating programming of a first bit of the plurality of bits of the OTP memory but not initiating programming of a second bit of the OTP memory, the first bit being initiated to lock the non-volatile memory from further data being written thereto, the second bit being associated with locking the non-volatile memory from data being erased therefrom; and after the non-volatile memory has been locked from further data being written thereto, initiate programming of the second bit of the OTP memory in order to lock the non-volatile memory from data being erased therefrom.

17. The method according to claim 16, further comprising checking a programming of the first bit of the OTP memory to determine if the non-volatile memory is unlocked for writing data thereto prior to performing the writing.

18. The method according to claim 16, further comprising refraining from writing data to, or erasing data from, the non-volatile memory, when the non-volatile memory is locked for writing data thereto, or erasing data therefrom, respectively, wherein:

the non-volatile memory is indicated as being locked for writing data thereto when the first bit of the OTP memory is programmed; and the non-volatile memory is indicated as being locked for erasing data therefrom, when the second bit of the OTP memory is programmed.

19. The method according to claim 16, wherein the plurality of data values includes any of the following: a plurality of cryptographic keys; a plurality of secrets; at least one identification; and/or at least one software code item.

20. The method according to claim 16, wherein the programming of the first bit and the programming of the second bit of the OTP memory is irreversible.

* * * * *